United States Patent
Okamura et al.

(10) Patent No.: US 8,432,227 B2
(45) Date of Patent: Apr. 30, 2013

(54) POWER AMPLIFIER

(75) Inventors: Atsushi Okamura, Tokyo (JP); Kazuya Yamamoto, Tokyo (JP); Takayuki Matsuzuka, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 13/301,955

(22) Filed: Nov. 22, 2011

(65) Prior Publication Data

US 2012/0306579 A1   Dec. 6, 2012

(30) Foreign Application Priority Data

May 31, 2011 (JP) .................................. 2011-121491

(51) Int. Cl.
*H03F 3/04* (2006.01)
(52) U.S. Cl.
USPC .......................................... 330/296; 330/285

(58) Field of Classification Search .................. 330/285, 330/296, 289, 271–273, 266–267
See application file for complete search history.

(56) References Cited

U.S. PATENT DOCUMENTS 6,946,913 B2   9/2005   Moriwaki et al.
7,795,980 B2 *  9/2010   Griffiths et al. ............... 330/298

FOREIGN PATENT DOCUMENTS

JP   2004-343244 A   5/2003

* cited by examiner

*Primary Examiner* — Hieu Nguyen
(74) *Attorney, Agent, or Firm* — Leydig, Voit & Mayer, Ltd.

(57) ABSTRACT

A power amplifier includes: an amplifying element having a base into which input signals are inputted, a collector to which a collector voltage is applied, and an emitter; and a bias circuit supplying a bias current to the base of the amplifying element. The bias circuit includes a bias current lowering circuit which lowers the bias current when the collector voltage is lower than a prescribed threshold value.

6 Claims, 15 Drawing Sheets

- - - - POSITIVE TEMPERATURE CHARACTERISTICS
OF LESS THAN 2%

———— POSITIVE TEMPERATURE CHARACTERISTICS
OF 10 to 20%

- - - - POSITIVE TEMPERATURE CHARACTERISTICS OF LESS THAN 2%

———— POSITIVE TEMPERATURE CHARACTERISTICS OF 10 to 20%

POWER AMPLIFIER

BACKGROUND OF THE INVENTION

1. Field of the Invention

The present invention relates to a power amplifier for mobile communication such as mobile telephones.

2. Background Art

Recently, GaAs-HBT (Hetero-junction Bipolar Transistor) power amplifiers are widely used as power amplifiers for mobile telephones including CDMA (Code Division Multiple Access), (for example, refer to Japanese Patent Application Laid-Open No. 2004-343244). In urban areas where base stations are relatively concentrated, the power amplifiers are mainly operated at middle-and-low output. Therefore, the improvement of operation efficiency is effective for the elongation of talk time of mobile telephones in the time of middle-and-low output operation. Consequently, the improvement of operation efficiency in the time of middle-and low output operation (approx. 0 to 17 dBm) is becoming important in addition to the time of high-output operation (approx. 28 dBm). For improving the operation efficiency in the time of middle-and low output operation, a method for lowering the collector voltage of amplifying elements depending on the output power by DC/DC converters has been known.

FIG. 16 is a graph showing the relation between the output power and the distortion of an amplifying element. FIG. 17 is a graph showing the relation between the output power and the operation efficiency of the amplifying element. When the collector voltage is lowered (Vc_High to Vc_Mid) the distortion characteristics are degraded and the efficiency are improved. In addition, although distortion characteristics are improved by lowering the output power, the operation efficiency is lowered. Therefore, by lowering the collector voltage and inhibiting the output power to the range where the output power satisfies the standards of distortion characteristics, the operation efficiency is improved.

FIGS. 18 and 19 are graphs showing the temperature characteristics of the distortion of an amplifying element. The output power is 17 dBm. Since the collector voltage cannot be much lowered when the variation of distortion is large at the time of Vc_Mid as shown in FIG. 18, the operation efficiency cannot be sufficiently improved. Therefore, distortion characteristics of favorable flatness at the time of Vc_Mid as shown in FIG. 19 are desired.

In addition, a bias circuit is used in the power amplifier for supplying bias to the amplifying element. FIGS. 20 and 21 are diagrams showing conventional bias circuits. Trb1 to Trb5 denote HBTs, Rb1 to Rb5 denote resistors, Vref denotes the reference voltage terminal of the bias circuit, Vcb denotes the collector power terminal of the bias circuit, and Vbo denotes the output terminal of the bias circuit.

SUMMARY OF THE INVENTION

FIG. 22 is a graph showing the temperature characteristics of the idle current of the power amplifier using the bias circuit of FIG. 20. Here, idle current means a bias current when no RF signals are inputted. FIG. 23 is a graph showing the temperature characteristics of the distortion of the power amplifier using the bias circuit shown in FIG. 20. FIG. 24 is a graph showing the temperature characteristics of the idle current of the power amplifier using the bias circuit shown in FIG. 21. FIG. 25 is a graph showing the temperature characteristics of the distortion of the power amplifier using the bias circuit shown in FIG. 21.

As seen from these graphs, the bias circuit shown in FIG. 20 has higher flatness of idle current or distortion relative to change in temperature. However, in the power amplifier having higher output power or operation current, the bias circuit shown in FIG. 21 is used instead of the bias circuit shown in FIG. 20. Therefore, in the power amplifier of high output power or operating current when the collector voltage of the amplifying element is lowered in the middle or low output operation, the variation of distortion to the variation of temperature is enlarged. For this reason, there was a problem wherein the efficiency improving effect by lowering the collector voltage was limited.

In view of the above-described problems, an object of the present invention is to provide a power amplifier which can sufficiently improve the operating efficiency even in the intermediate or low output operation.

According to the present invention, a power amplifier includes: an amplifying element having a base in which input signals are inputted, a collector to which a collector voltage is applied, and an emitter; and a bias circuit supplying a bias current to the base of the amplifying element, wherein the bias circuit includes a bias current lowering circuit which lowers the bias current when the collector voltage is lower than a prescribed threshold value.

The present invention makes it possible to sufficiently improve the operating efficiency even in the intermediate or low output operation.

Other and further objects, features and advantages of the invention will appear more fully from the following description.

DETAILED DESCRIPTION OF THE PREFERRED EMBODIMENTS

A power amplifier according to the embodiments of the present invention will be described with reference to the drawings. The same components will be denoted by the same symbols, and the repeated description thereof may be omitted.

First Embodiment

Figure 1:
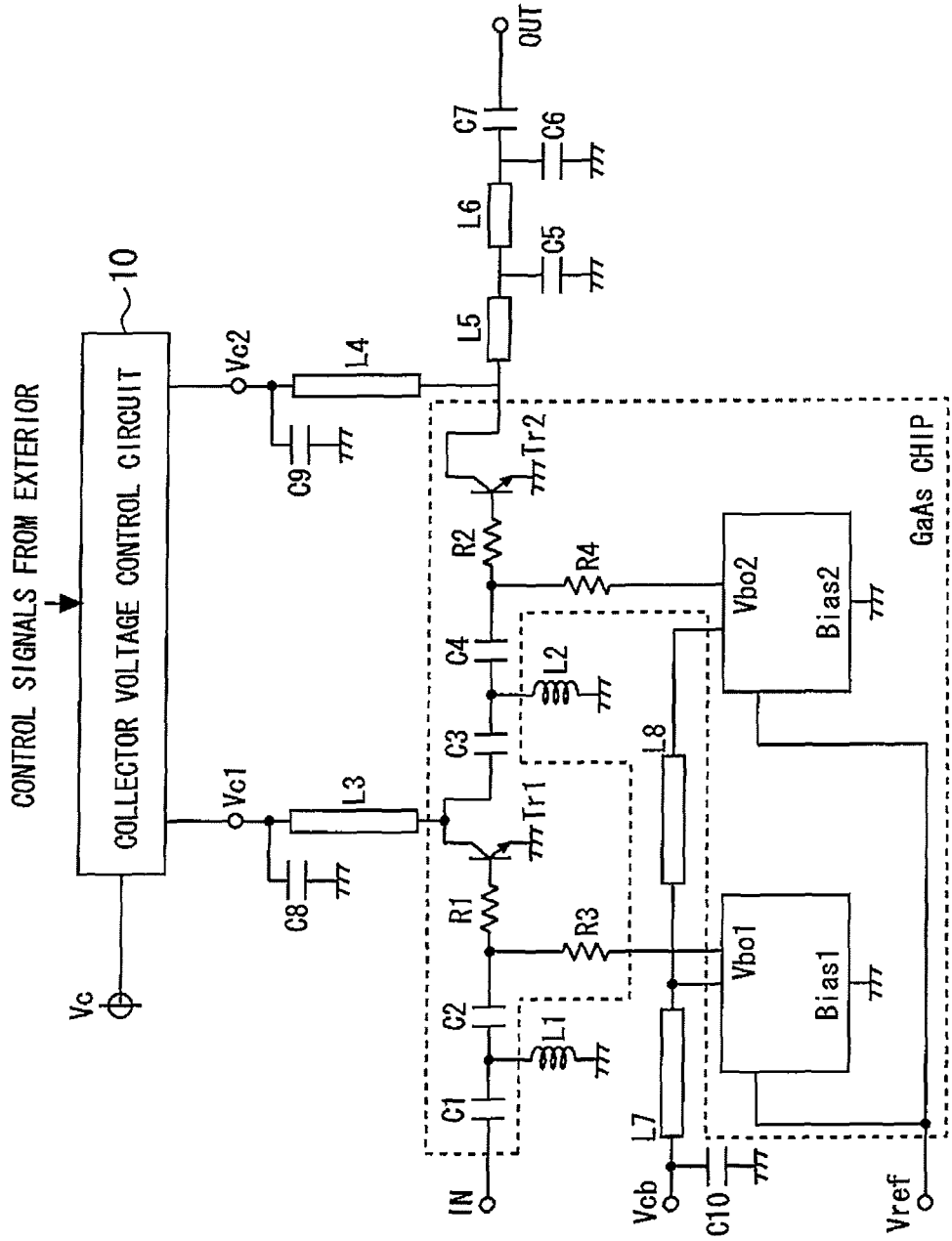
FIG. 1 is a diagram showing a power amplifier according to the first embodiment of the present invention.

FIG. 1 is a diagram showing a power amplifier according to the first embodiment of the present invention. The power amplifier is a two-step amplifier formed by a BiFET process wherein an HBT and an FET are formed on a same substrate. A GaAs-HBT power amplifier and a bias circuit are integrated on the same GaAs chip. The region within the dot-line frame is the GaAs chip, and circuit elements shown outside the dot line are formed by chip parts and lines on the module substrate.

A Tr1 which is a first-stage amplifying element for amplifying input signals, and a Tr2 which is a subsequent-stage amplifying element for amplifying output signals from the Tr1 are formed on the same GaAs substrate. The Tr1 and Tr2 are GaAs-HBTs. Input signals are inputted in the base of the Tr1, a collector voltage is applied to the collector, and the emitter is grounded. Bias1 is a first-stage bias circuit for supplying a bias current to the base of the Tr1, and Bias2 is a subsequent-stage bias circuit for supplying the bias current to the base of the Tr2.

IN is an RF signal input terminal. OUT is an RF signal output terminal. R1 to R4 are resistors, C1 to C10 are capacitors, and L1 and L2 are inductors. L3 to L8 are lines having specific electrical length, and act as inductors. Vc is a collector power source terminal, Vc1 is a collector power source terminal for the Tr1, Vc2 is collector power source terminal for the Tr2, Vcb is a power source terminal for the Bias1 and Bias2, and Vref is a terminal for applying a reference voltage to the Bias1 and Bias2.

The collector voltage control circuit 10 is a DC/DC convertor for supplying the collector voltage wherein the voltage inputted from the Vc terminal to Tr1 and Tr2, respectively. By this collector voltage control circuit 10, the collector voltages supplied to the Tr1 and Tr2 in the intermediate and low output operations of the power amplifier are lowered. Although the collector voltage control circuit 10 controls the collector voltage corresponding to the control signals from the exterior, it can control the collector voltage by monitoring the output power of the power amplifier.

Figure 2:
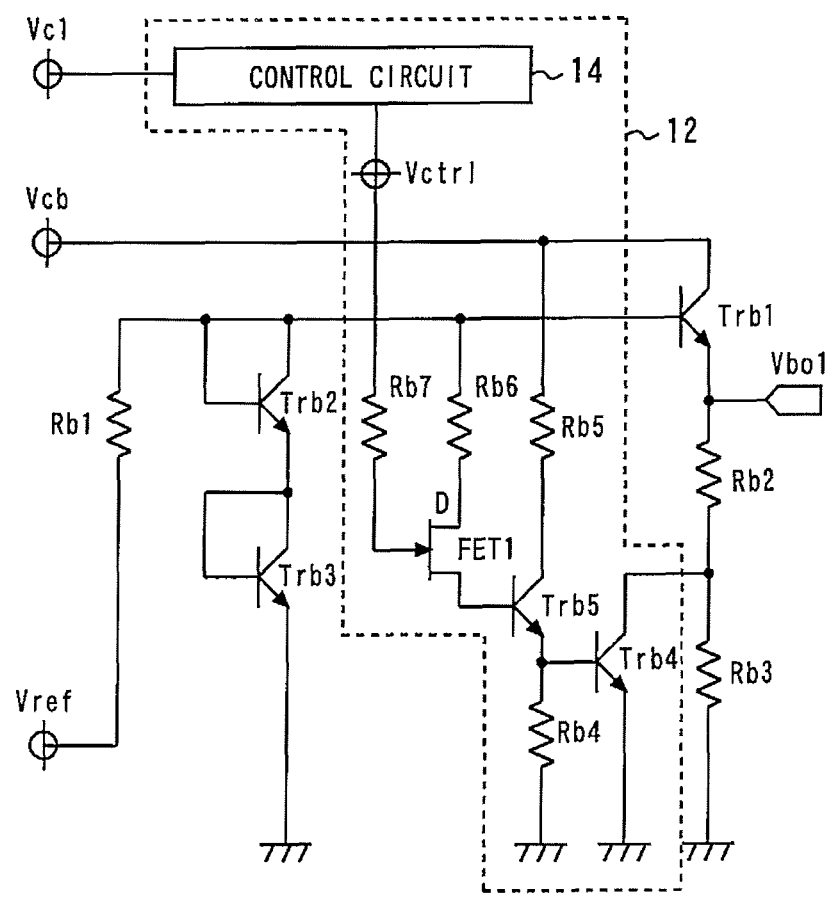
FIG. 2 is a diagram showing a bias circuit according to the first embodiment of the present invention.

FIG. 2 is a diagram showing a bias circuit according to the first embodiment of the present invention. The bias circuit is a first-stage bias circuit Bias1 for supplying a bias current to the base of the first-stage amplifying element Tr1 in FIG. 1. The configuration of the subsequent-stage bias circuit Bias2 is also the same.

A reference voltage is inputted to the base of the bias transistor Trb1 via the Vref terminal and the resistor Rb1. To the collector of the Trb1, a power voltage is inputted via the Vcb terminal. The emitter of the Trb1 is connected to the base of the Tr1 via the Vbo1 terminal.

A first resistor Rb2 is connected to the emitter of the Trb1, and a second resistor Rb3 is connected between the Rb2 and the grounding point. The Trb2 and the Trb3 wherein the base and the collector are short-circuited are connected in series between the base of the Trb1 and the grounding point.

The bias current lowering circuit 12 has transistors Trb4 and Trb5, an FET1, resistors Rb4 to Rb7, and a control circuit 14. The Trb4 and the Trb5 are GaAs-HBTs, and the FET1 is a GaAs-FET. The threshold voltage of the FET1 is −0.2 to −1.0 V.

The collector of the Trb4 is connected between the Rb2 and the Rb3, and the emitter is grounded. An Rb4 is connected between the base of the Trb4 and the grounding point. The collector of the Trb5 is connected to the Vcb terminal via the Rb5, and the emitter thereof is connected to the base of the Trb4. The drain of the FET1 is connected to the Vref terminal via the Rb6, and the source thereof is connected to the base of the Trb5. As the voltage for turning the Trb4 and Trb5 ON, approx. 1.3 V (Trb4)+approx. 1.3 V (Trb5)=approx. 2.5 V is needed. Therefore, the drain voltage of the FET1 is made to be 2.5 V or higher.

The control circuit 14 supplies a control voltage Vctrl to the gate of the FET1 via the Rb7. The control circuit 14 makes the Vctrl High (2.5 V) when the collector voltage inputted from the Vc1 terminal is lower than the prescribed threshold voltage, and makes the Vctrl Low (0 V) when the collector voltage inputted from the Vc1 terminal is higher than the prescribed threshold voltage. Here, since the FET1 is turned OFF (0−2.5=−2.5V<−1.0 V @ threshold voltage) when the gate voltage of the FET1 is 0V (Vctrl=Low), the Trb5 and Trb4 are also turned OFF. On the other hand, since the FET1 is turned ON (2.5−2.5=0V>−1.0 V @ threshold voltage) when the gate voltage of the FET1 is 2.5V (Vctrl=High), the Trb5 and Trb4 are also turned ON.

As described above, the control circuit 14 turns the FET1, Trb5, and Trb4 ON when the collector voltage is lower than the prescribed threshold value. As a result, the bias current lowering circuit 12 lowers a bias current (idle current) when the collector voltage is lowered than the prescribed threshold value.

Figure 3:
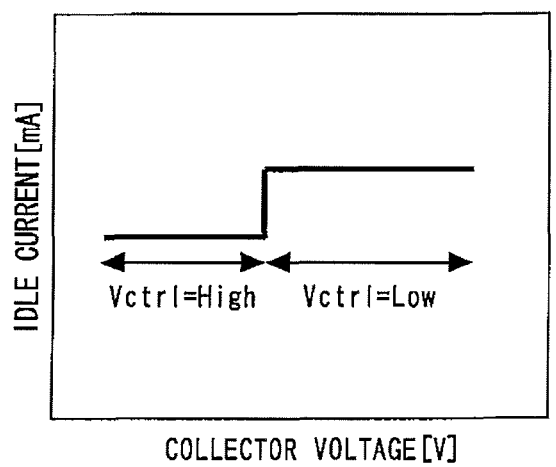
FIG. 3 is a diagram showing the relationship between the collector voltage and the idle current of the power amplifier according to the first embodiment of the present invention.

FIG. 3 is a diagram showing the relationship between the collector voltage and the idle current of the power amplifier according to the first embodiment of the present invention. It is seen that the idle current is lowered when the collector voltage is lower than the prescribed threshold value.

Figure 4:
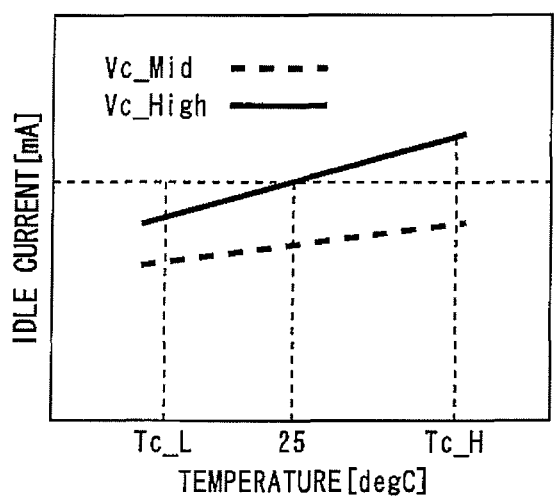
FIG. 4 is a graph showing the temperature characteristics of the idle current of a power amplifier according to the first embodiment of the present invention.
Figure 5:
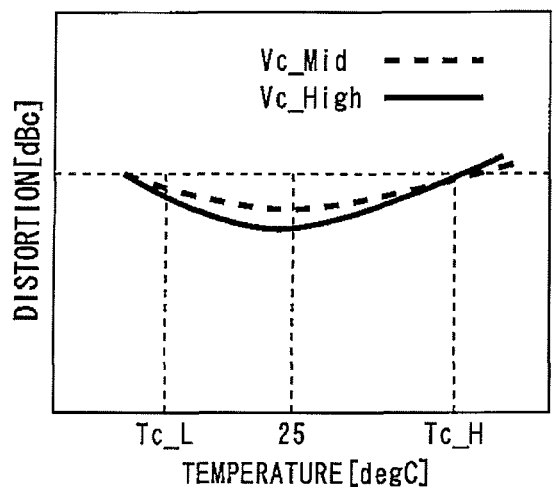
FIG. 5 is a graph showing the temperature characteristics of the distortion of a power amplifier according to the first embodiment of the present invention.

FIG. 4 is a graph showing the temperature characteristics of the idle current of a power amplifier according to the first embodiment of the present invention. FIG. 5 is a graph showing the temperature characteristics of the distortion of a power amplifier according to the first embodiment of the present invention. It is seen that even if the collector voltage is lowered than the prescribed threshold value (Vc_High to Vc_Mid), the variation of the idle current and the distortion by change in temperatures is small.

As described above, in the present embodiment, the bias current lowering circuit 12 lowers the bias current (idle current) when the collector voltage is lowered than the prescribed threshold value. Thereby, even when the collector voltage controlling circuit 10 lowers the collector voltage of the amplifying element in the medium or low output operation, the variation of the distortion by change in temperature is not enlarged. Therefore, since the collector voltage can be sufficiently lowered, the operating efficiency can be sufficiently improved even in the intermediate or low output operation.

Figure 6:
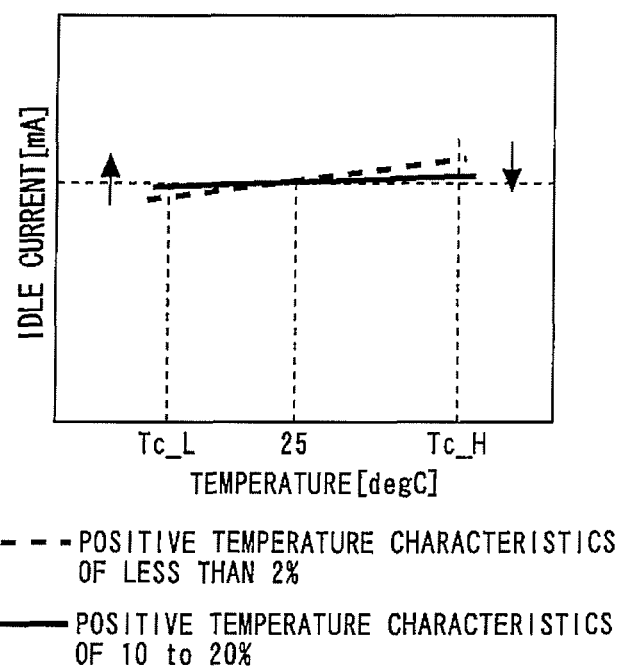
FIG. 6 is a graph showing the temperature characteristics in the idle current of the power amplifier according to the first embodiment of the present invention.
Figure 7:
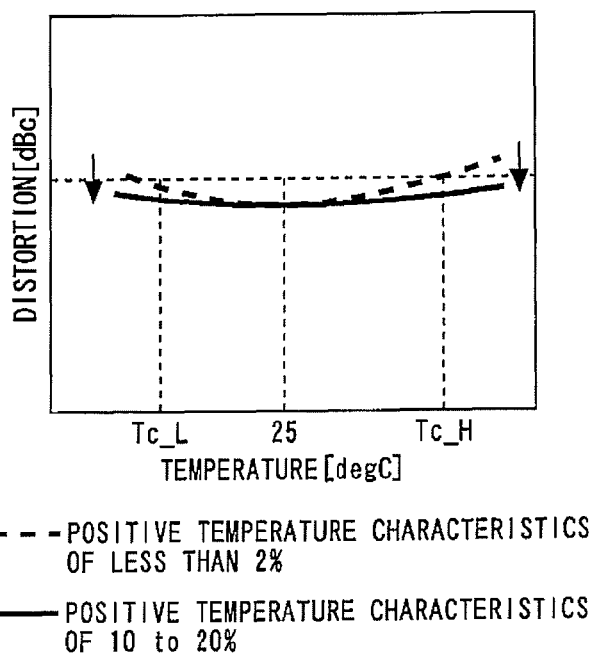
FIG. 7 is a graph showing the temperature characteristics of the distortion of the power amplifier according to the first embodiment of the present invention.

FIG. 6 is a graph showing the temperature characteristics in the idle current of the power amplifier according to the first embodiment of the present invention. FIG. 7 is a graph showing the temperature characteristics of the distortion of the power amplifier according to the first embodiment of the present invention. It is seen that when the Rb3 has positive temperature characteristics of 10 to 20% (when the elevation of the resistor value to the temperature elevation is 10 to 20%), the variation of the idle current and distortion to the variation of temperatures is smaller comparing to the case when having positive temperature characteristics of less than 2%. As a semiconductor resistor easily formed by the ordinary semiconductor process of GaAs, a resistor having temperature characteristics of 10 to 20% was described as an example. However, the example is not limited to this, but sufficient effects can be obtained when the Rb3 has positive temperature characteristics of 10% or higher.

Figure 8:
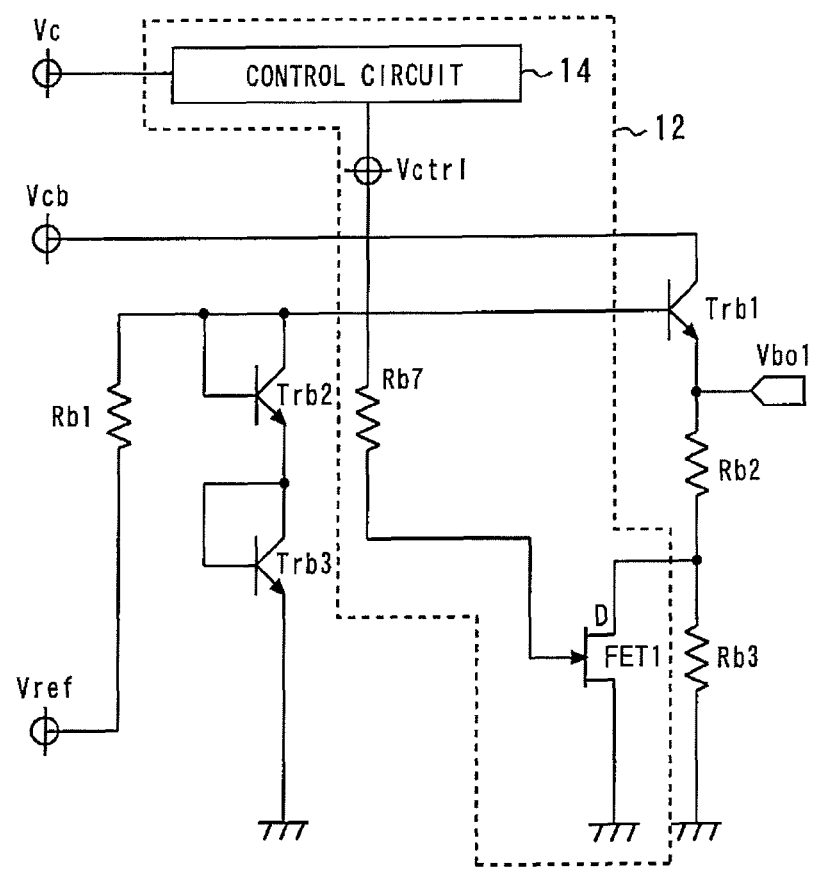
FIG. 8 is a diagram showing the modified example 1 of the bias circuit according to the first embodiment of the present invention.

FIG. 8 is a diagram showing the modified example 1 of the bias circuit according to the first embodiment of the present invention. Compared with the bias circuit shown in FIG. 2, Trb4, Trb5, and Rb4 to Rb6 are omitted. The drain in FET1 is connected between the Rb2 and the Rb3, and the source is grounded. Even in this case, the effects described above can be obtained. However, the FET1 must be an enhancement type so that the FET1 can be turned OFF even when the source voltage and the control voltage are all positive potentials.

Figure 9:
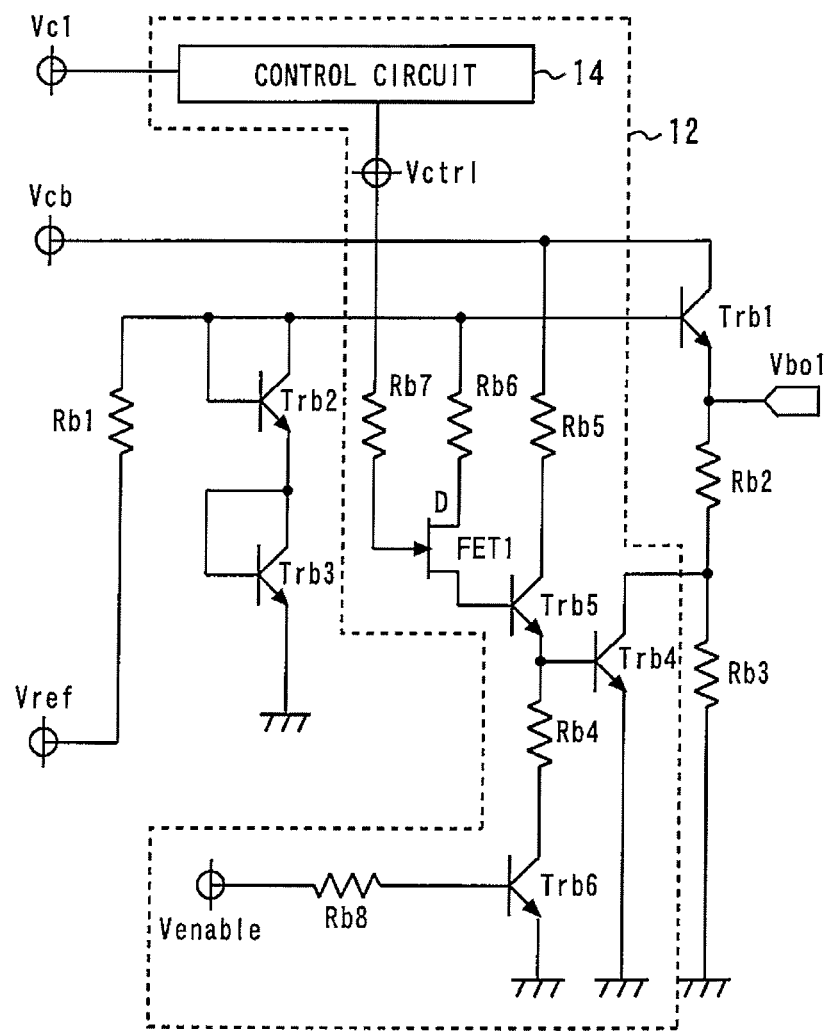
FIG. 9 is a diagram showing the modified example 2 of the bias circuit according to the first embodiment of the present invention.

FIG. 9 is a diagram showing the modified example 2 of the bias circuit according to the first embodiment of the present invention. A transistor Trb6, which is a GaAs-FET is connected between the Rb4 and the grounding point, and a Venable terminal is connected to the base of the Trb6 via the resistor Rb8. Enable signals for turning ON/OFF the bias current lowering circuit 12 are inputted from the Venable terminal. Thereby, the bias current lowering circuit 12 can be surely turned OFF in the vicinity of the threshold value.

Second Embodiment

Figure 10:
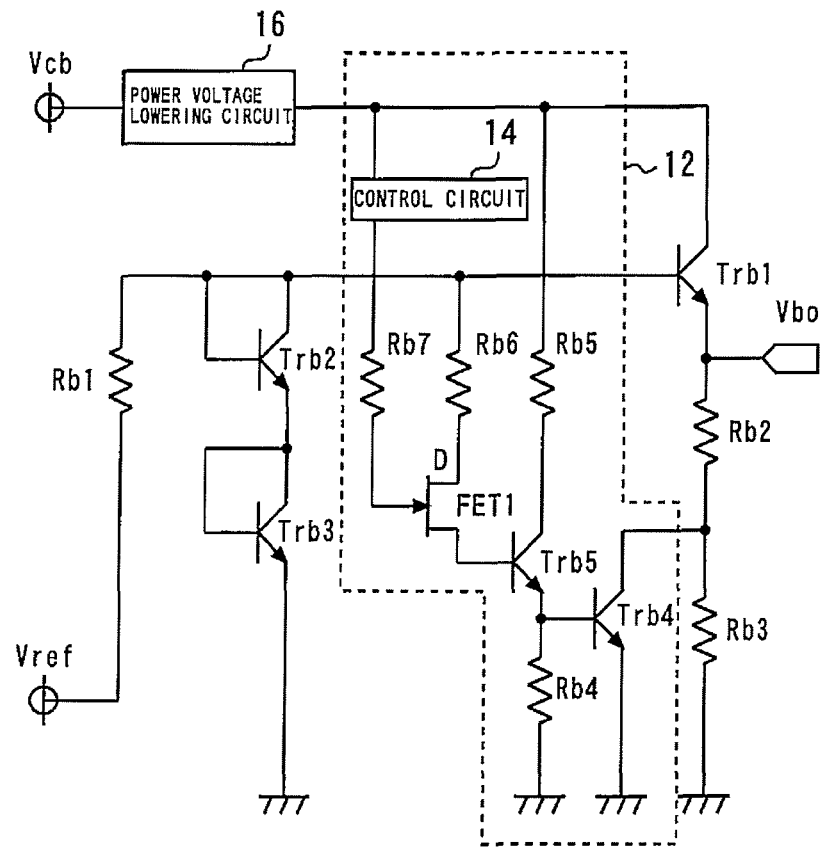
FIG. 10 is a diagram showing a bias circuit according to the second embodiment of the present invention.

FIG. 10 is a diagram showing a bias circuit according to the second embodiment of the present invention. In the second embodiment, a power voltage lowering circuit 16 is added to the first embodiment, and the controlling method for the controlling circuit 14 is different.

When the collector voltage is lowered, the power voltage lowering circuit 16 lowers the power voltage inputted from the Vcb terminal and supplies the power voltage to the Bias 1 and Bias 2. Although the power voltage lowering circuit 16 controls the power voltage corresponding to the control signals from the exterior, the output power of the power amplifier can be monitored and controlled. When the power voltage supplied from the power voltage lowering circuit 16 is lower than the prescribed threshold value, the controlling circuit 14 elevates the Vctrl to be High (2.5V), and when the power voltage is higher than the prescribed threshold value, the controlling circuit 14 lowers the Vctrl to be Low (0V).

Figure 11:
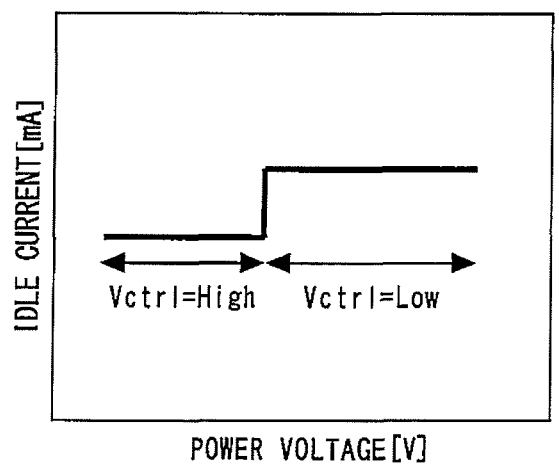
FIG. 11 is a graph showing the relationship between the power voltage and the idle current in the power amplifier according to the second embodiment of the present invention.

FIG. 11 is a graph showing the relationship between the power voltage and the idle current in the power amplifier according to the second embodiment of the present invention. It can be seen that the idle current is lowered when the power voltage is lower than the prescribed threshold value.

As described above, in the present embodiment, when the collector voltage of the amplifying element is lowered in the time of intermediate and low output, the power voltage of the bias circuit is also lowered. Thereby, the idle current can be lowered, the effects identical to the effects of the first embodiment can be obtained, and the current consumption of the bias circuit can also be lowered.

Third Embodiment

Figure 12:
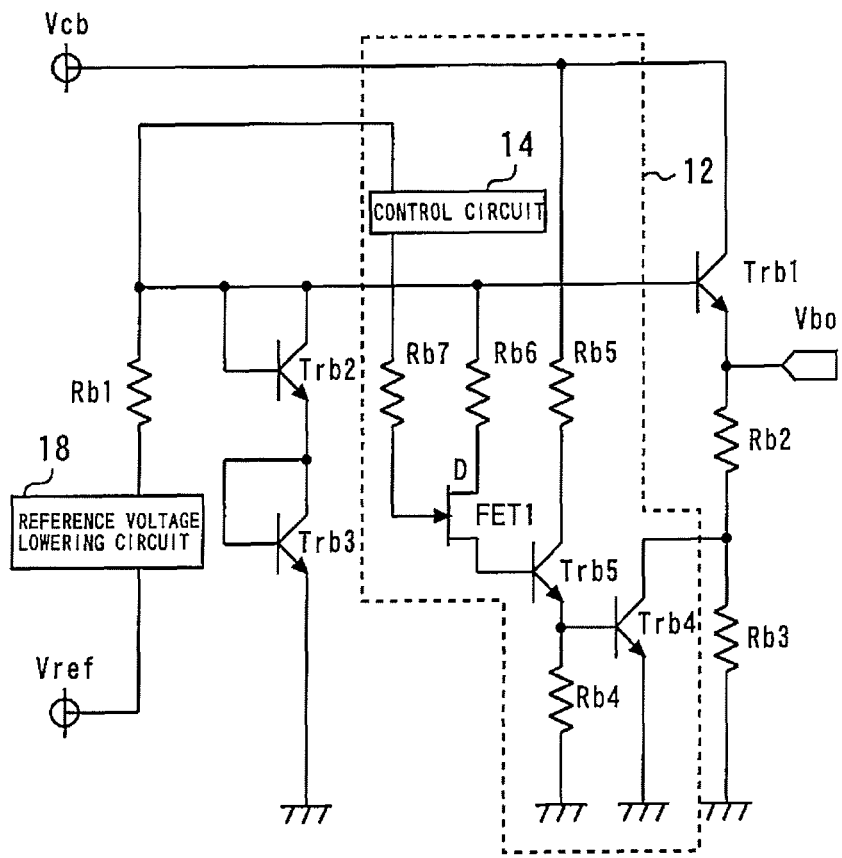
FIG. 12 is a diagram showing a bias circuit according to the third embodiment of the present invention.

FIG. 12 is a diagram showing a bias circuit according to the third embodiment of the present invention. In the third embodiment, a reference voltage lowering circuit 18 is added to the first embodiment, and the controlling method for the controlling circuit 14 is different.

When the collector voltage is lowered, the reference voltage lowering circuit 18 lowers the reference voltage, and supplies it to the Bias 1 and Bias 2. Although the reference voltage lowering circuit 18 controls the reference voltage corresponding to control signals from the exterior, the output power of the power amplifier may also be monitored and controlled. The control circuit 14 elevates the Vctrl to High (2.5 V) when the reference voltage supplied from the reference voltage lowering circuit 18 is lower than the prescribed threshold value, and lowers the Vctrl to Low (0 V) when the reference voltage is higher than the prescribed threshold value.

Figure 13:
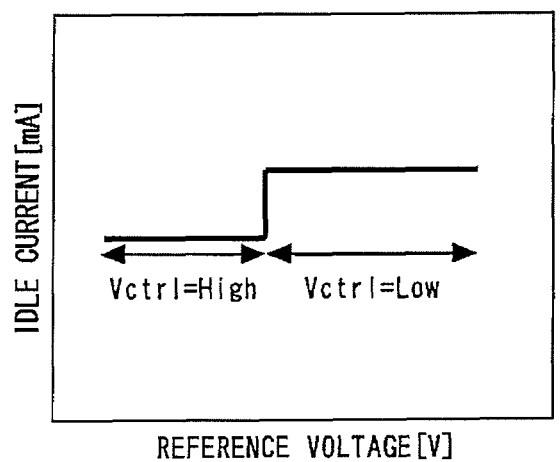
FIG. 13 is a graph showing the relationship between the reference voltage and the idle current in the power amplifier according to the third embodiment of the present invention.

FIG. 13 is a graph showing the relationship between the reference voltage and the idle current in the power amplifier according to the third embodiment of the present invention. It is seen that the idle current becomes lower when the reference voltage is lower than the predetermined threshold value.

In the present embodiment, as described above, when the collector voltage of the amplifying element is lowered in the intermediate and low output, the reference voltage of the bias circuit is also lowered. Thereby, the idle current is lowered, and the effect identical to the effect of the first embodiment can be obtained.

Fourth Embodiment

Figure 14:
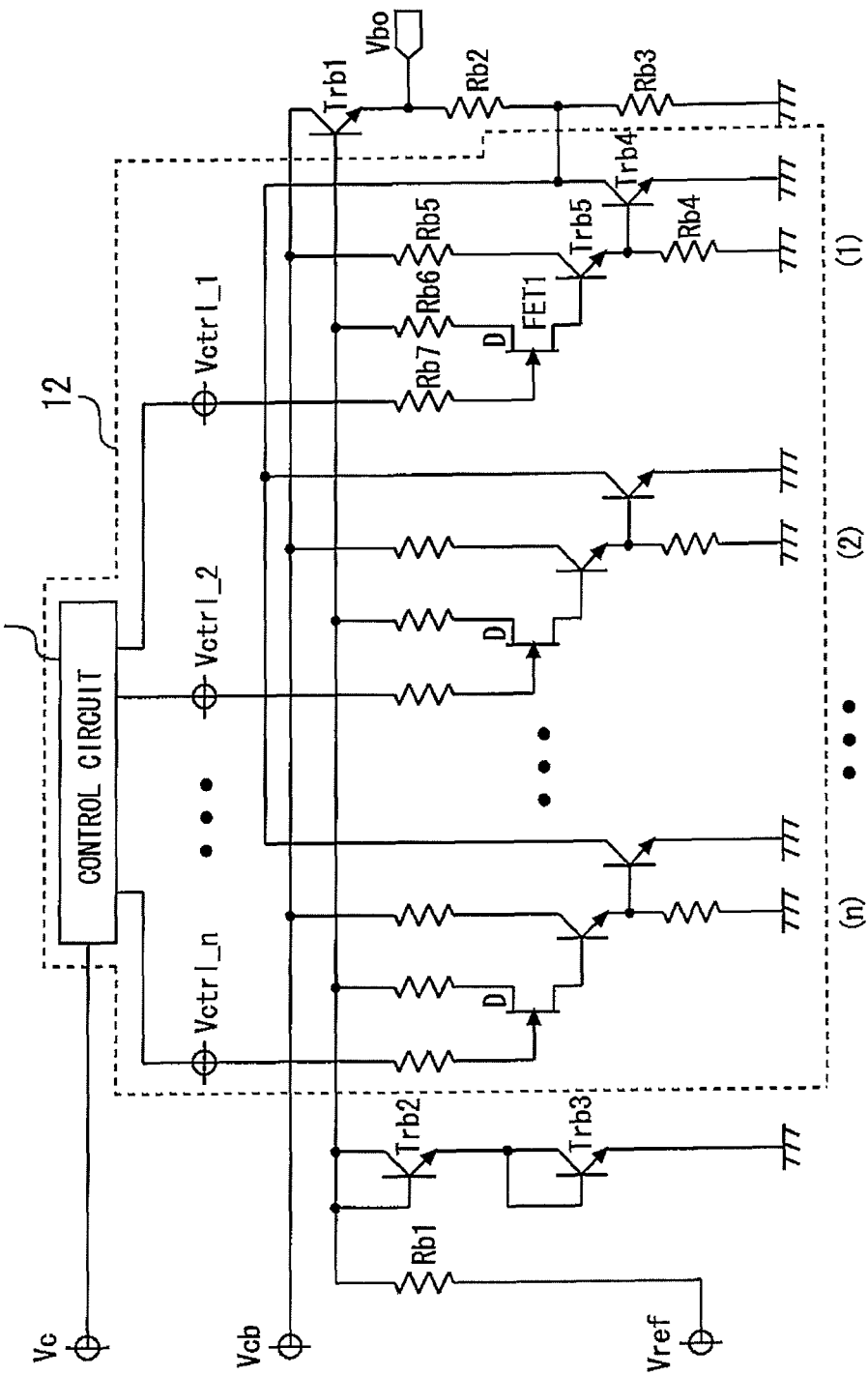
FIG. 14 is a diagram showing a bias circuit according to the fourth embodiment of the present invention.

FIG. 14 is a diagram showing a bias circuit according to the fourth embodiment of the present invention. The bias current lowering circuit 12 in the present embodiment has a plurality of bias current lowering circuits that lower the bias current when collector voltages are lower than the plurality of threshold values that are different from each other. The configuration of each bias current lowering circuit is identical to the configuration of the bias current lowering circuit 12 in the first embodiment.

Figure 15:
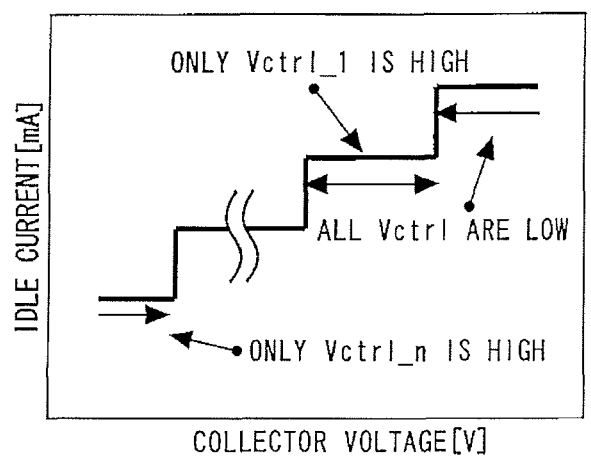
FIG. 15 is a graph showing the relationship between the collector voltage and the idle current in the power amplifier according to the fourth embodiment of the present invention.
Figure 16:
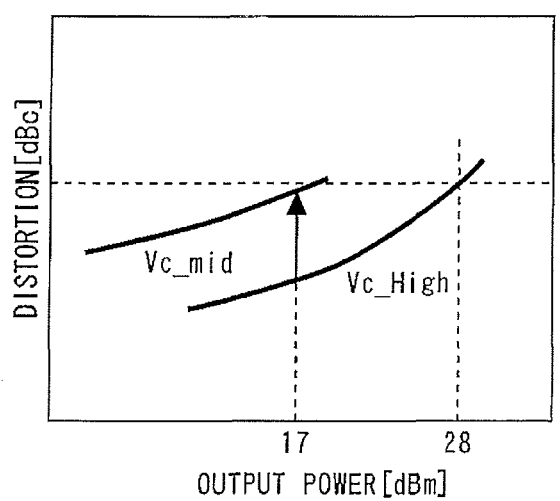
FIG. 16 is a graph showing the relation between the output power and the distortion of an amplifying element.
Figure 17:
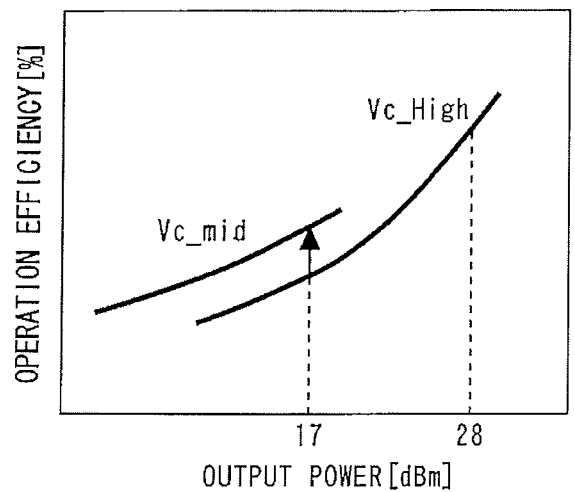
FIG. 17 is a graph showing the relation between the output power and the operation efficiency of the amplifying element.
Figure 18:
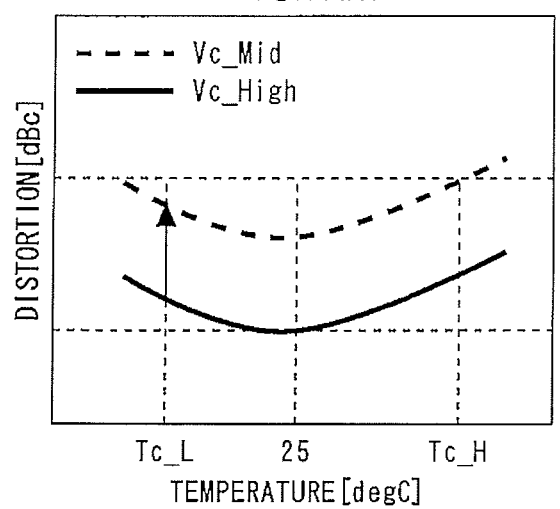
FIGS. 18 and 19 are graphs showing the temperature characteristics of the distortion of an amplifying element.
Figure 19:
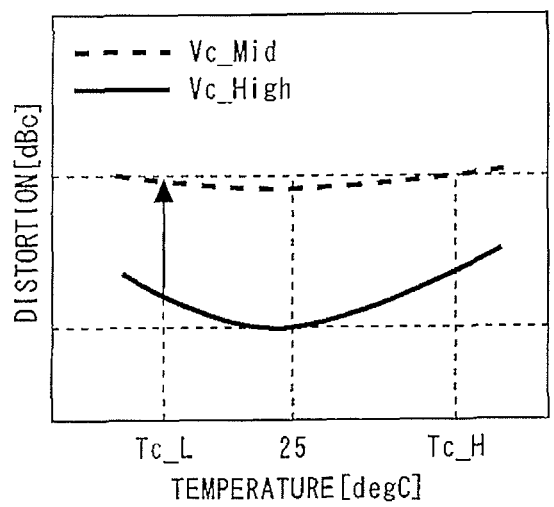
Figure 20:
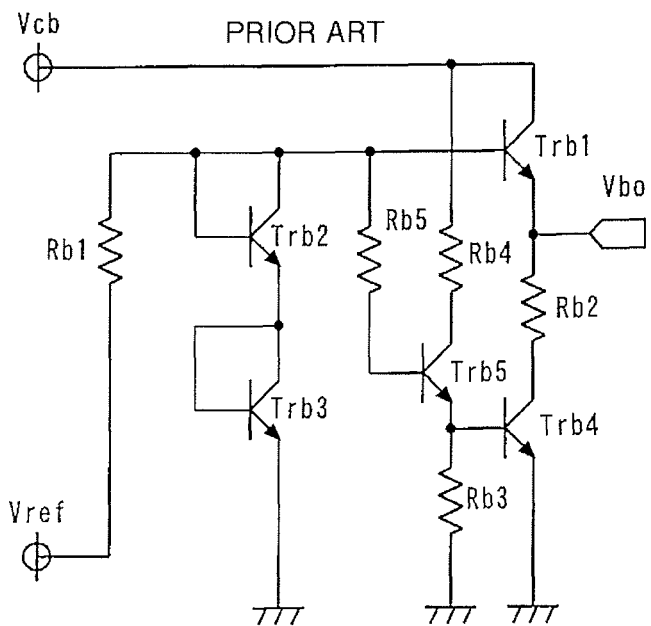
FIGS. 20 and 21 are diagrams showing conventional bias circuits.
Figure 21:
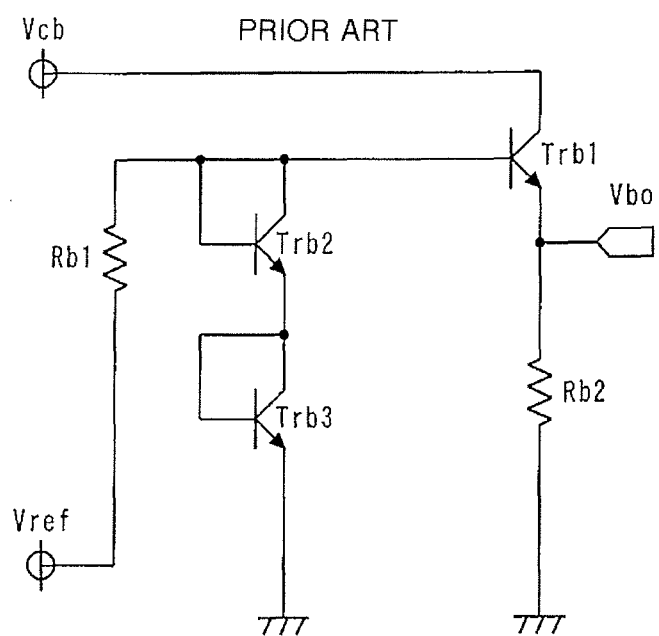
Figure 22:
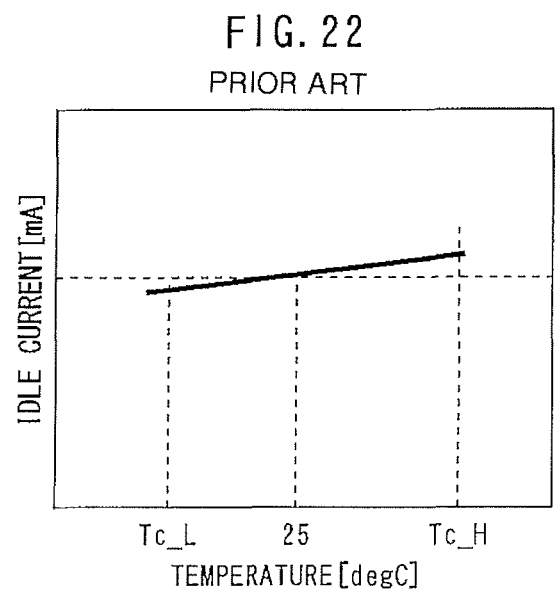
FIG. 22 is a graph showing the temperature characteristics of the idle current of the power amplifier using the bias circuit of FIG. 20.
Figure 23:
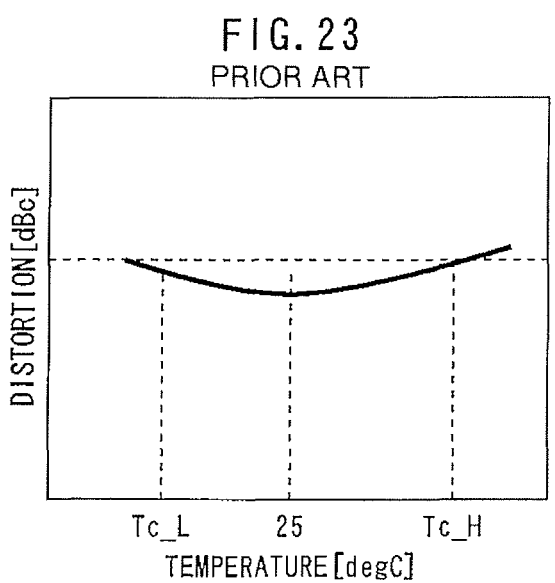
FIG. 23 is a graph showing the temperature characteristics of the distortion of the power amplifier using the bias circuit shown in FIG. 20.
Figure 24:
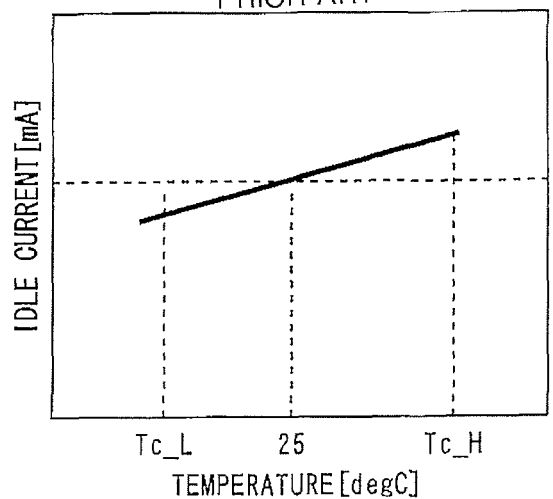
FIG. 24 is a graph showing the temperature characteristics of the idle current of the power amplifier using the bias circuit shown in FIG. 21.
Figure 25:
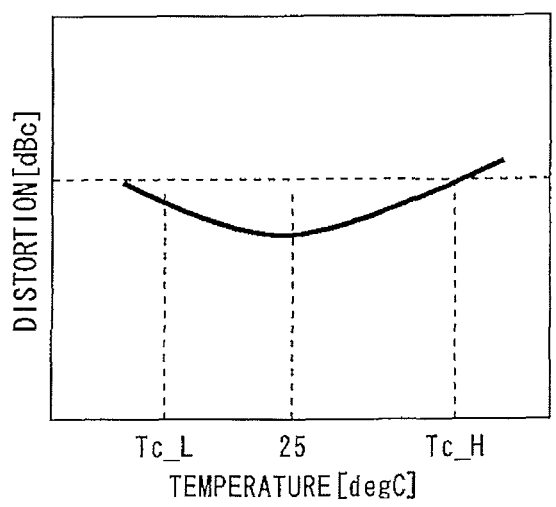
FIG. 25 is a graph showing the temperature characteristics of the distortion of the power amplifier using the bias circuit shown in FIG. 21.

FIG. 15 is a graph showing the relationship between the collector voltage and the idle current in the power amplifier according to the fourth embodiment of the present invention. In the present embodiment, idle currents can be switched more frequently than in the first embodiment.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-121491, filed on May 31, 2011 including specification, claims, drawings and summary, on which the Convention priority of the present application is based, are incorporated herein by reference in its entirety.

What is claimed is:

1. A power amplifier comprising:
   an amplifying element having a base into which input signals are input, a collector to which a collector voltage is applied, and an emitter; and
   a bias circuit supplying a bias current to the base of the amplifying element, wherein the bias circuit includes
      a bias transistor having a control terminal into which a reference voltage is input, a first terminal into which a power voltage is input, and a second terminal connected to the base of the amplifying element,
      a first resistor connected to the second terminal of the bias transistor,
      a second resistor connected between the first resistor and a grounding point, and
      a bias current lowering circuit which lowers the bias current when the collector voltage is lower than a first prescribed threshold value and which includes
         a transistor having a control terminal, a first terminal connected between the first resistor and the second resistor, and a second terminal that is grounded, and
         a control circuit supplying a control voltage to the control terminal of the transistor.

2. The power amplifier according to claim 1, wherein the control circuit turns the transistor ON when the collector voltage is lower than the first prescribed threshold value.

3. The power amplifier according to claim 1, further comprising a power voltage lowering circuit which lowers the power voltage when the collector voltage is lowered, wherein the control circuit turns the transistor ON when the power voltage is lower than a second prescribed threshold value.

4. The power amplifier according to claim 1, further comprising a reference voltage lowering circuit which lowers the reference voltage when the collector voltage is lowered, wherein the control circuit turns the transistor ON when the reference voltage is lower than a second prescribed threshold value.

5. The power amplifier according to claim 1, wherein the second resistor has positive temperature characteristics of at least 10%.

6. The power amplifier according to claim 1, wherein the bias current lowering circuit includes a plurality of bias current lowering circuits which lower respective bias currents when the collector voltage is lower than a plurality of threshold values that are different from each other.

* * * * *